United States Patent [19]

Yamamoto et al.

[11] Patent Number: 5,759,336
[45] Date of Patent: Jun. 2, 1998

[54] RESIST REMOVING APPARATUS

[75] Inventors: Masayuki Yamamoto; Takao Matsushita, both of Ibaraki, Japan

[73] Assignee: Nitto Denko Corporation, Osaka, Japan

[21] Appl. No.: 746,647

[22] Filed: Nov. 13, 1996

[30] Foreign Application Priority Data

Nov. 16, 1995 [JP] Japan ................... 7-323840

[51] Int. Cl.$^6$ ................................................ H01L 21/30
[52] U.S. Cl. ................ 156/379.6; 156/382; 156/584; 156/344; 156/241
[58] Field of Search ........................ 156/241, 234, 156/247, 344, 382, 584, 379.6

[56] References Cited

U.S. PATENT DOCUMENTS 5,466,325  11/1995  Mizuno et al. .

FOREIGN PATENT DOCUMENTS 6-267893  9/1994  Japan .

Primary Examiner—Michael W. Ball
Assistant Examiner—Sam Chuan Yao
Attorney, Agent, or Firm—Nikaido, Marmelstein, Murray & Oram LLP

[57] ABSTRACT

A resist removing apparatus for removing unnecessary resist patterns from articles such as semiconductor substrates efficiently by using adhesive tape. A tape applicator unit is movable horizontally to apply the adhesive tape in strip form to a wafer supported on an applicator table. Then, a set of the tape applicator unit and a tape separator unit and a set of the applicator table and a separator table are moved horizontally relative to each other to shift the separator table under the wafer supported through the adhesive tape. A next wafer is transported to and placed on the applicator table in an unloaded state. The tape applicator unit and tape separator unit are moved horizontally and simultaneously to apply the adhesive tape to the wafer on the applicator table and separate the adhesive tape from the wafer on the separator table at the same time.

11 Claims, 13 Drawing Sheets

RESIST REMOVING APPARATUS

BACKGROUND OF THE INVENTION

1. Field of the Invention

This invention relates to apparatus for removing, in time of manufacture, resist patterns which have become unnecessary from surfaces of various micro-fabricated articles such as semiconductor substrates, printed circuit boards, masks and lead frames.

2. Description of the Related Art

When manufacturing a semiconductor device, for example, a resist solution is applied to a semiconductor substrate such as a silicon wafer. A predetermined image (resist pattern) is formed thereon through a usual photographic process. The resist pattern is used as a mask in various processes including ion injection, etching and doping. Subsequently, the resist pattern no longer needed is removed to form a predetermined circuit. Then, the resist solution is applied again to form a next circuit. This cycle is repeated. Also where circuits are formed on various substrates, unnecessary resist patterns are removed after image formation. Generally, unnecessary resist patterns are removed using an asher (ashing device) or a solvent (releasing solution). When the asher is used, the operation may be time-consuming, and impurity ions in the resist solution could remain on the surfaces of wafers. Use of the solvent poses the problem of impairing work environment.

An apparatus for removing unnecessary resist patterns has been proposed recently, as disclosed in Japanese Patent Publication (Unexamined) No. H6-267893. With this apparatus, adhesive tape is applied to a surface of a resist pattern under atmospheric pressure, and this adhesive tape is separated along with the resist pattern from a wafer surface. This process will be described with reference to FIGS. 1A–1H. As shown in FIG. 1A, a wafer W is transported to and placed on an applicator table 180. Next, as shown in FIG. 1B, an applicator roller 182 runs rightward in the figure while pressing adhesive tape T on the upper surface of wafer W, whereby the adhesive tape T is applied to the resist pattern on the wafer surface. At this time, the wafer W is heated by the applicator table 180 to increase an area of contact between the adhesive of the adhesive tape T and the resist pattern. When the adhesive tape T has been applied, a suction pad 184 of the applicator table 180 is raised as shown in FIG. 1C. Subsequently, as shown in FIG. 1D, the wafer W is temporarily supported by a transport mechanism 186, and the applicator table 180 and a separator table 181 are moved rightward in the figure, whereby the separator table 181 is set to a standby position under the wafer W. Next, as shown in FIGS. 1E and 1F, a suction pad 185 of the separator table 181 is raised and lowered to place the wafer W on the separator table 181. As shown in FIG. IG, the adhesive tape on the surface of wafer W is irradiated with ultraviolet rays to increase the cohesion between the resist pattern on the wafer W and and the adhesive. Subsequently, as shown in FIG. 1H, a separator roller 183 is moved rightward in the figure to separate the adhesive tape T along with the resist pattern from the upper surface of wafer W. After this separating process, a next wafer W is transported to the applicator table 180 as shown in FIG. 1A, and the above operation is repeated.

However, since the above apparatus carries out the applying and separating processes sequentially, processing of each article consumes a period of time corresponding to a sum of time required for tape application and time required for tape separation. Thus, there is a limitation to improvement in processing efficiency. Furthermore, since adhesive tape is applied to articles under atmospheric pressure, air caught between the adhesive tape and the article forms bubbles in recesses of the resist pattern. These bubbles lower the cohesion between the adhesive tape and the resist pattern. As a result, the resist pattern cannot be separated reliably.

SUMMARY OF THE INVENTION

This invention has been made having regard to the state of the art noted above, and its object is to provide a resist removing apparatus for enabling improved processing efficiency (throughput) in removing unnecessary resist patterns from articles such as semiconductor substrates.

Another object of this invention is to separate resist patterns with a reliable cohesion between adhesive tape and resist patterns.

The above objects are fulfilled, according to this invention by an apparatus for removing resist patterns from surfaces of articles by applying adhesive tape in strip form to the surfaces of the articles covered with the resist patterns, and separating the adhesive tape from the surfaces of the articles, the apparatus comprising:

an applicator table for supporting the articles when the adhesive tape is applied to the surfaces of the articles covered with the resist patterns;

an applicator table lift mechanism for vertically moving the applicator table between an upper applying position and a lower standby position;

a separator table disposed adjacent the applicator table for supporting the articles when the adhesive tape is separated from the surfaces of the articles;

a separator table lift mechanism for vertically moving the separator table between an upper separating position and a lower standby position;

a transport mechanism for transporting the articles to the applicator table, and transporting the articles from the separator table;

a tape applicator unit for applying the adhesive tape in strip form to the surfaces of the articles supported on the applicator table;

a tape separator unit for separating the adhesive tape from the surfaces of the articles supported on the separator table; and a relative drive mechanism for horizontally moving a set of the tape applicator unit and the tape separator unit and a set of the applicator table and the separator table relative to each other;

wherein the above mechanisms are operable to apply and separate the adhesive tape to/from the surfaces of the articles in parallel through the following processes (1)–(7):

(1) the applicator table is raised to the applying position after an article covered with the resist pattern is placed on the applicator table;

(2) the tape applicator unit applies the adhesive tape in strip form to the article on the applicator table;

(3) the applicator table is lowered to the standby position while supporting the article through the adhesive tape in strip form extending between the tape applicator unit and the tape separator unit;

(4) the set of the tape applicator unit and the tape separator unit and the set of the applicator table and the separator table are moved horizontally relative to each other, whereby the separator table moves under the article supported through the adhesive tape;

(5) a next article is transported to and placed on the applicator table unloaded and lying in the standby position;

(6) the applicator table is moved to the applying position, and the separator table to the separating position; and (7) the tape applicator unit and the tape separator unit operate substantively simultaneously, the tape separator unit separating the adhesive tape from the article on the separator table, the tape applicator unit applying the adhesive tape to the next article on the applicator table.

According to this invention, an article to which the adhesive tape has been applied on the applicator table is transferred to the separator table. When the adhesive tape is separated from the article on the separator table, a next article is transported to the applicator table. In this way, separation of the adhesive tape from the article on the separator table and application of the adhesive tape to the article on the applicator table are carried out in parallel, to realize an improved processing efficiency of the apparatus.

Preferably, the applicator table includes a heater for heating the articles placed thereon. It is also preferred that the tape applicator unit includes a heater for heating the adhesive tape when applying the adhesive tape to the articles on the applicator table. The above heaters soften the adhesive of the adhesive tape to facilitate movement of the adhesive into small recesses in the article surface, thereby enlarging an area of contact between adhesive tape and article.

Preferably, the adhesive tape is an ultraviolet curable adhesive tape, and the apparatus further comprises an ultraviolet generator for irradiating with ultraviolet rays the adhesive tape applied to the article supported on the separator table after the separator table is raised to the separating position in the process (6) and before the adhesive tape is separated from the article on the separator table in the process (7). With this construction, the adhesive of the adhesive tape is cured by ultraviolet irradiation to strengthen the cohesion between the adhesive tape and the resist pattern on the surface of the article.

The apparatus according to this invention may further comprise a decompression mechanism for covering the applicator table and the tape applicator unit, the tape applicator unit carrying out the process (2) of applying the adhesive tape to the article on the applicator table in a decompressed atmosphere inside the decompression mechanism. This construction provides the advantage of diminishing air trapped between the adhesive tape and the article surface. When atmospheric pressure is reinstated after the adhesive tape is applied to the article, atmospheric pressure acts uniformly over the article through the adhesive tape, to promote tight contact between adhesive tape and resist pattern.

The tape applicator unit may be in form of a horizontally movable roller, for example. Alternatively, the tape applicator unit may include a thin elastic member for dividing a decompression enclosure in the decompression mechanism into a lower enclosure and an upper enclosure. The elastic member is expanded toward the lower enclosure by reducing an internal pressure of the lower enclosure below an internal pressure of the upper enclosure to produce a pressure difference between the upper enclosure and the lower enclosure, to press the elastic member through the adhesive tape upon the surface of the article supported on the applicator table, thereby to apply the adhesive tape to the article.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DESCRIPTION OF THE PREFERRED EMBODIMENTS

Preferred embodiments of this invention will be described in detail hereinafter with reference to the drawings.

<First Embodiment>

Figure 1A:
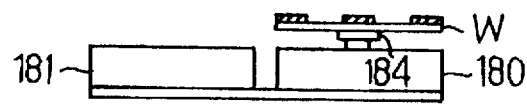
FIGS. 1A through 1H are explanatory views of an adhesive tape applying and separating operation according to the prior art.
Figure 1B:
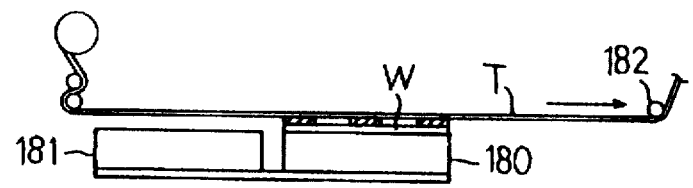
Figure 1C:
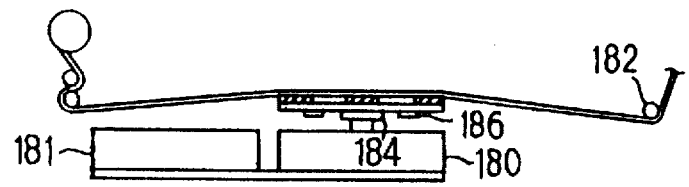
Figure 1D:
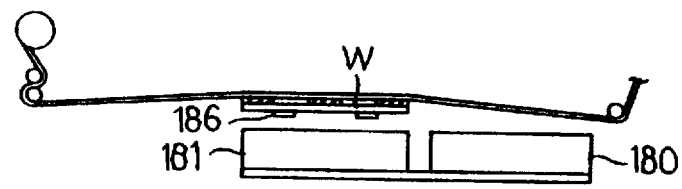
Figure 1E:
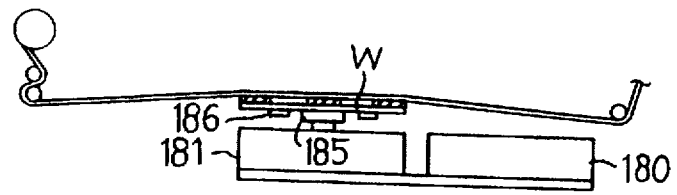
Figure 1F:
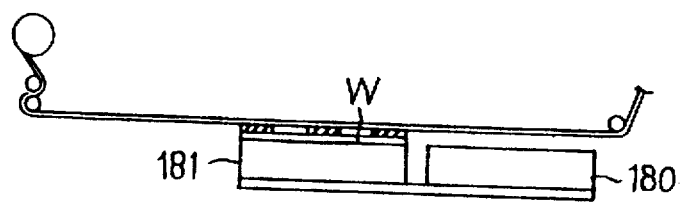
Figure 1G:
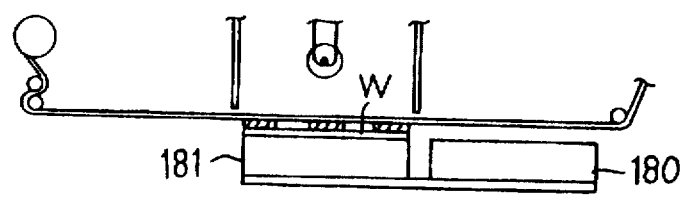
Figure 1H:
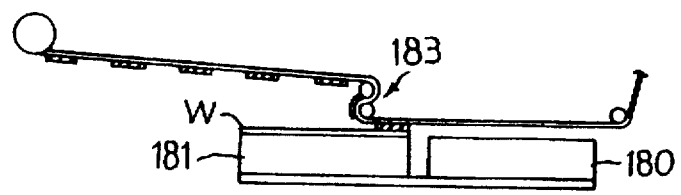
Figure 2:
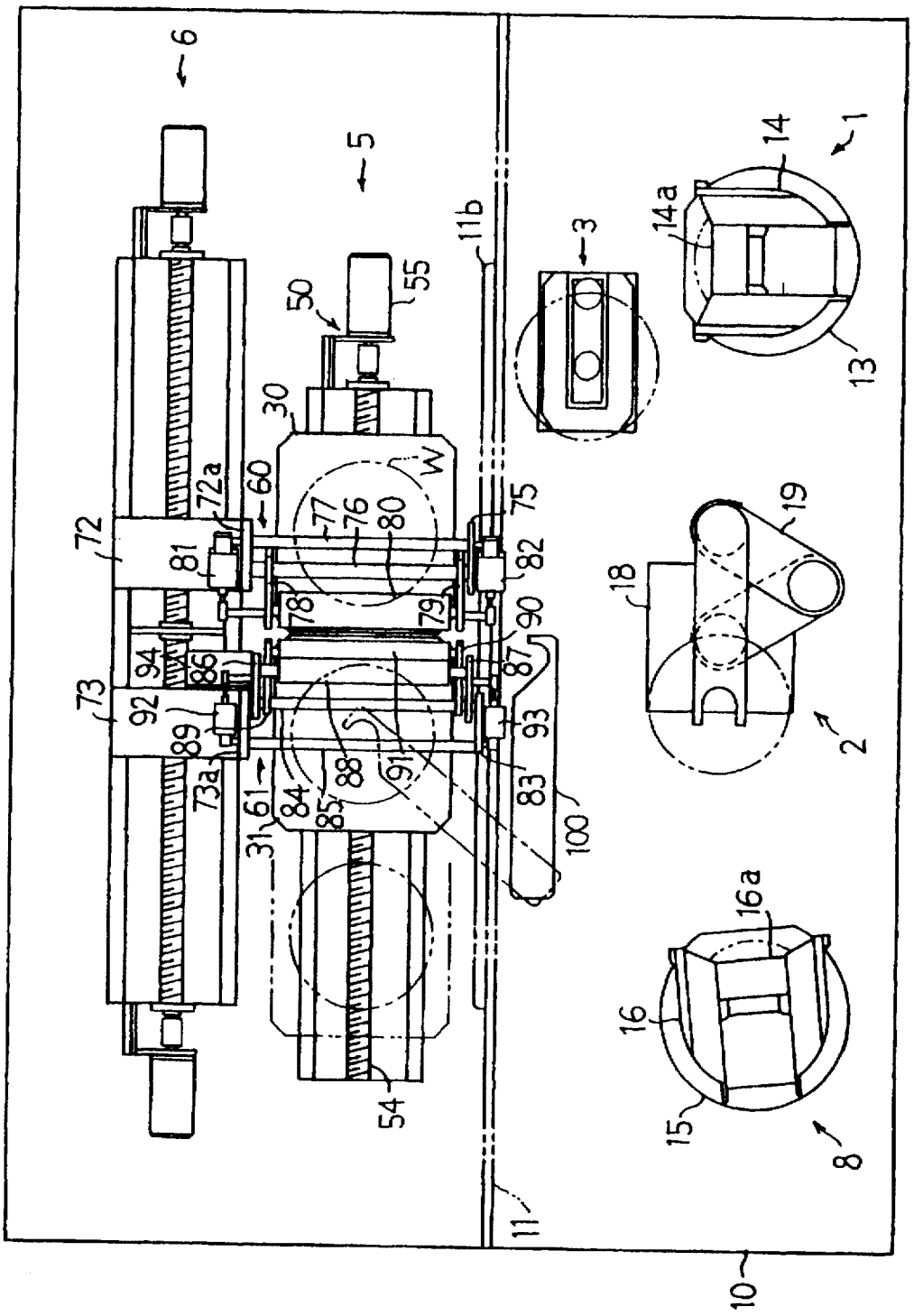
FIG. 2 is an overall plan view of a resist removing apparatus in a first embodiment of this invention.
Figure 3:
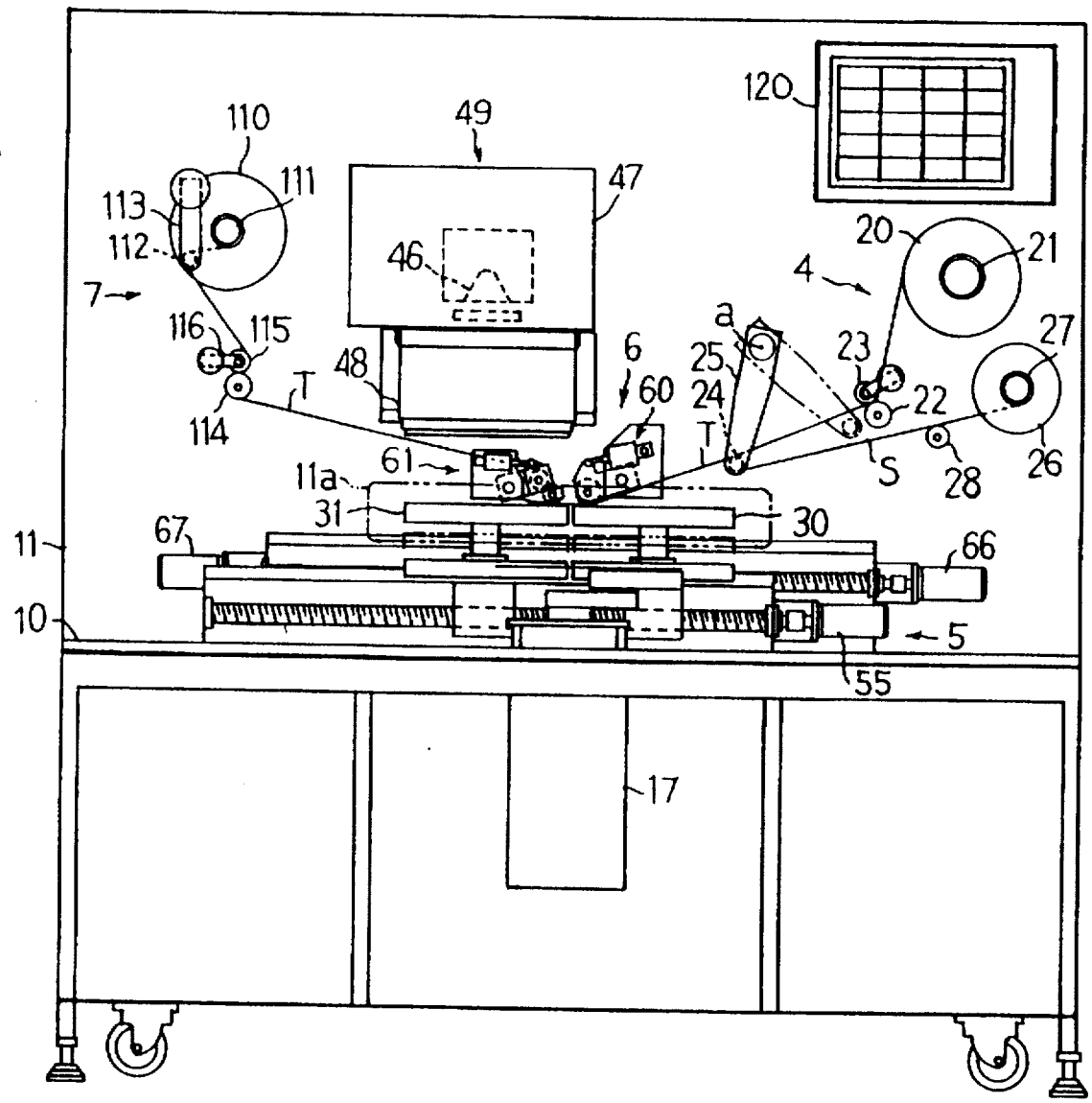
FIG. 3 is an overall front view of the apparatus in the first embodiment.

An apparatus in a first embodiment will be described with reference to FIGS. 2 and 3. FIG. 2 is an overall plan view of the apparatus. FIG. 3 is an overall front view of the apparatus.

The resist removing apparatus in this embodiment, broadly, includes:

a wafer supplying station 1 for receiving a cassette 14 containing wafers W stacked therein, each wafer W having a resist pattern formed on a surface thereof;

a transport mechanism 2 including a robot arm 19 for flexion and swinging movement thereon, and an alignment stage 3 for adjusting positions of wafers W;

a tape server 4 for supplying adhesive tape T to a tape applicator and separator unit assembly 6 described later;

an applicator and separator table assembly 5 including an applicator table 30 for supporting wafer W when adhesive tape T is applied to the surface thereof, and a separator table 31 disposed adjacent the applicator table 30 for supporting wafer W when adhesive tape T is separated from the surface thereof, the applicator table 30 and separator table 31 being movable horizontally together and vertically independently of each other;

the tape applicator and separator unit assembly 6 including a tape applicator unit 60 for applying adhesive tape T to the surface of wafer W placed on the applicator table 30, and a tape separator unit 61 for separating adhesive tape T from the surface of wafer W placed on the separator table 31, the tape applicator unit 60 and tape separator unit 61 being movable horizontally independently of each other;

a tape collector 7 for collecting adhesive tape T separated from the surface of wafer W; and a wafer collecting station 8 for receiving a cassette 16 for storing processed wafers W as stacked therein.

The above components are arranged on a base 10 and a base wall 11 extending across a substantially middle region of the base 10. The base wall 11 has a slot 11a formed in a lower middle portion thereof for allowing passage therethrough of wafers W. In FIG. 3, the base wall 11 is shown in phantom for expediency of illustration.

Details of the respective components will be described hereinafter.

As shown in FIG. 2, the wafer supplying station 1 is disposed in a rightward front position on the base 10. The wafer supplying station 1 includes a rotatable supplying table 13 for removably receiving a cassette 14 containing wafers W stacked therein. The wafers W are stacked with the surfaces thereof having resist patterns facing upward. After the cassette 14 is placed on the supplying table 13, the supplying table 13 is turned to have a wafer outlet 14a of the cassette 14 opposed to the transport mechanism 2.

The wafer collecting station 8 has a construction similar to the wafer supplying station 1, and is disposed in a leftward front position on the base 10. When an empty cassette 16 is placed on a collecting table 15, the collecting table 15 is turned to have a wafer inlet 16a of the cassette 16 opposed to the transport mechanism 2.

As shown in FIGS. 2 and 3, the transport mechanism 2 is disposed in a middle front position on the base 10. The robot arm 19 is flexibly and pivotably mounted on an arm base 18 vertically movable by a lift mechanism 17. The robot arm 19 has a distal end thereof in the form of a thin plate for suction-supporting each wafer W by a lower surface thereof and taking the wafer W out of the cassette 14 at the wafer supplying station 1. The transport mechanism 2 then transports the wafer W to the alignment stage 3 and then to the applicator table 30 described hereinafter. Further, the transport mechanism 2 transports wafers W stripped of the resist pattern from the separator table 31 into the cassette 16 at the wafer collecting station 8 to be stacked successively therein.

The alignment stage 3 optically detects an orientation flat, notch or the like in each wafer W to adjust position of the wafer W as required in subsequent processing.

As shown in FIG. 3, the tape server 4 is disposed adjacent a rightward rear portion of the base wall 11. A tape roll 20 of adhesive tape T of the ultraviolet curable type joined with a separator S in strip form is fitted on a rotary axis 21 supported in horizontal posture by the base wall 11. Obliquely below the tape roll 20 are a fixed roller 22 and a pinch roller 23 spring-loaded toward the fixed roller 23. Leftward from these rollers 22 and 23 is a separator roller 24 for separating the separator S from the adhesive tape T. The separator roller 24 is supported in a cantilever fashion by a free end of an arm 25 oscillatable about a horizontal axis "a". With oscillation of the separator roller 24, the adhesive tape T unwound from the tape roll 20 and passed by way of the pinch roller 23 is maintained in constant tension to be fed to the tape applicator unit 60 described hereinafter. Below the tape roll 20 is a separator collecting roll 26 for taking up the separator S turned back at an acute angle around the separator roller 24. The roll 26 is fitted on a rotary axis 27 supported in horizontal posture by the base wall 11. The rotary axis 27 is operatively connected to a motor, not shown, to take up the separator S, thereby to feed the adhesive tape T to the tape applicator unit 60. Leftward from the separator collecting roll 26 is a fixed roller 28 for guiding and supporting the separator S between the separator roller 24 and separator collecting roll 26.

Figure 4:
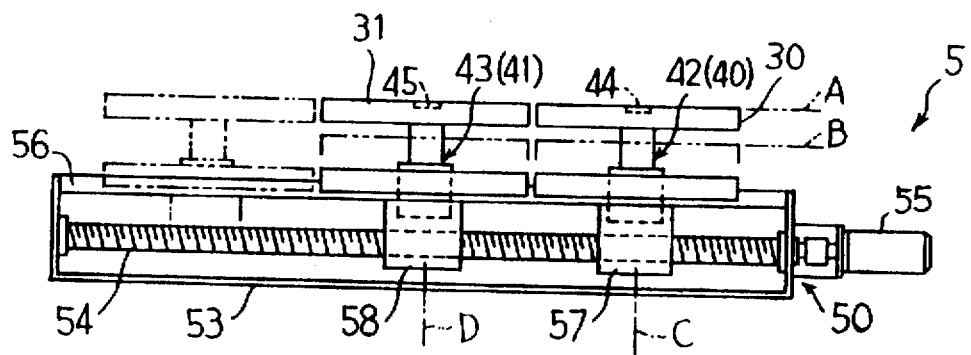
FIG. 4 is a front view of an applicator and separator table assembly.

The construction of the applicator and separator table assembly 5 will be described with reference to FIG. 4 also. FIG. 4 is a front view of the applicator and separator table assembly 5.

The applicator and separator table assembly 5 includes the applicator table 30 and separator table 31, table lift mechanisms 40 and 41, and a horizontal table drive mechanism 50. The table lift mechanisms 40 and 41 vertically move the applicator table 30 and separator table 31, respectively, between an applying and separating position A (the applicator table 30 and separator table 31 being raised by extension of air cylinders 42 and 43 described hereinafter) and a standby position B (the applicator table 30 and separator table 31 being lowered by contraction of air cylinders 42 and 43). The horizontal table drive mechanism 50 moves the applicator table 30 and separator table 31 horizontally together between a first processing position C (position of the applicator table 30 shown in FIG. 4) and a second processing position D (position of the separator table 31 shown in FIG. 4).

The horizontal table drive mechanism 50 includes a screw shaft 54 supported in horizontal posture by a base plate 53 disposed rearwardly of the base wall 11, a motor 55 for rotating the screw shaft 54, a pair of front and rear slide rails 56 extending parallel to the screw shaft 54, and a pair of right and left movable members 57 and 58 slidable along the slide rails 56 and mounted on and meshed with the screw shaft 54.

The movable members 57 and 58 have air cylinders 42 and 43, respectively. The applicator table 30 and separator table 31 are fixedly mounted in horizontal posture on forward ends of rods of the respective air cylinders, 42 and 43. The air cylinders 42 and 43 correspond to the table lift mechanisms 40 and 41 noted hereinbefore. A slide space is provided to the left of the second processing position D for accommodating the separator table 31 so that the applicator table 30 is reciprocable by the motor 55 between the first processing position C and second processing position D. Thus, the applicator table 30 and separator table 31 are driven horizontally together. The horizontal table drive mechanism 50 corresponds to the relative drive mechanism of this invention.

Each of the applicator table 30 and separator table 31 has a suction pad 44 or 45 embedded centrally thereof and connected to an air cylinder, not shown, for raising and lowering wafers W. The applicator table 30 has a heater, not shown, mounted therein to be heated normally to about 80° to 150° C. The heat from the heater softens the adhesive of adhesive tape T on the surface of wafer W suction-supported on the applicator table 30. As a result, the adhesive flows into recesses of the resist pattern, thereby enlarging an area of contact between the resist pattern and adhesive.

Above the separator table 31 is an ultraviolet irradiating unit 49 attached to the base wall 11 (see FIG. 3). The ultra-violet irradiating unit 49 includes an ultraviolet generator 47 having an ultraviolet lamp 46, and a hood 48 movable downward to the separator table 31 to prevent leakage of ultraviolet rays outwardly of the separator table 31. By irradiating wafer W with ultraviolet rays, the adhesive of ultraviolet curable adhesive tape T is cured to strengthen its cohesion with the resist pattern.

Figure 5:
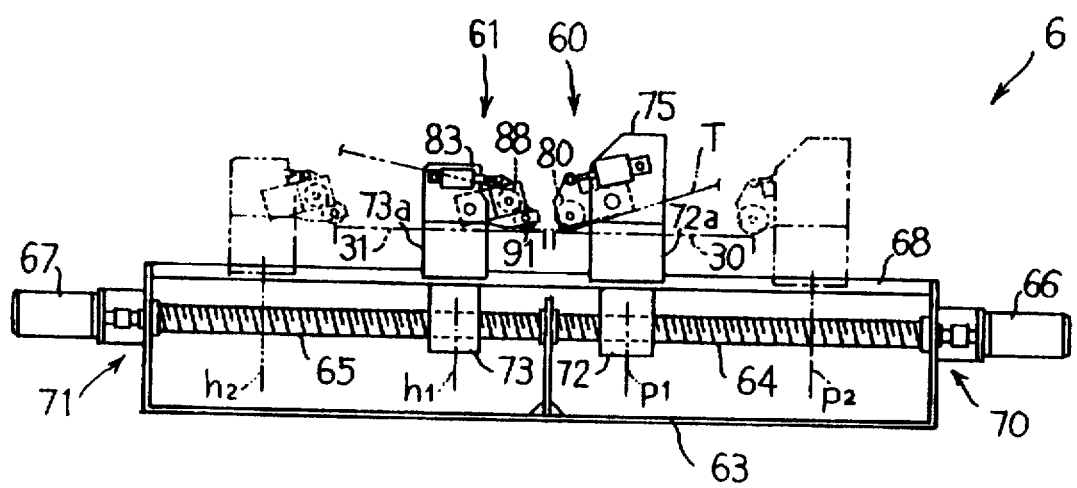
FIG. 5 is a front view of a tape applicator and separator unit assembly.

The construction of tape applicator and separator unit assembly 6 will be described with reference to FIGS. 2, 3 and 5. FIG. 5 is a front view of the tape applicator and separator unit assembly 6.

The tape applicator and separator unit assembly 6 includes the tape applicator unit 60 for applying adhesive tape T to wafer W on the applicator table 30, the tape separator unit 61 for separating the resist pattern along with adhesive tape T from wafer W on the separator table 31, and horizontal tape applicator and separator unit drive mechanisms 70 and 71 for horizontally moving the tape applicator unit 60 between an application start position $p_1$ (with an applicator roller 80 present at a left end of the applicator table 30) and an application finish position $p_2$ (with the applicator roller 80 at a right end of the applicator table 30), and horizontally moving the tape separator unit 61 between a separation start position $h_1$ (with a separator roller 91 present at a left end of the separator table 31) and a separation finish position $h_2$ (with the separator roller 91 at a right end of the separator table 31). The horizontal tape applicator and separator unit drive mechanisms 70 and 71 include screw shafts 64 and 65 supported in horizontal posture by a base plate 63 disposed rearwardly of the base plate 53 of the applicator and separator table assembly 5 and divided in a middle position of the base plate 63, motors 66 and 67 for rotating the screw shafts 64 and 65, respectively, a pair of front and rear slide rails 68 extending parallel to the screw shafts 64 and 65, and movable members 72 and 73 slidable along the slide rails 68 and mounted on and meshed with the screw shafts 64 and 65, respectively. The tape applicator unit 60 and tape separator unit 61 extend horizontally forward from vertical walls 72a and 73a of the movable members 72 and 73, respectively.

As shown in FIG. 2, the tape applicator unit 60 includes two support rods 76 and 77 fixedly supported between the vertical wall 72a of the movable member 72 and a support wall 75 disposed in a front position opposed to the vertical wall 72a. A pair of front and rear oscillatable members 78 and 79 are rotatably supported at proximal ends thereof by opposite end portions of the support rod 76. The applicator roller 80 extends between and is rotatably supported by free ends of the oscillatable members 78 and 79. Air cylinders 81 and 82 are attached to a rear surface of the vertical wall 72a and a front surface of the support wall 75, respectively. The air cylinders 81 and 82 have rods connected to the free ends of the oscillatable members 78 and 79. Thus, extension and contraction of the air cylinders 81 and 82 cause the applicator roller 80 to oscillate vertically about the support rod 76 through the oscillatable members 78 and 79.

The tape separator unit 61 includes a pair of right and left support rods 84 and 85 fixedly supported between the vertical wall 73a of the movable member 73 and a support wall 83 disposed in a front position opposed to the vertical wall 73a. A pair of front and rear oscillatable members 86 and 87 are rotatably supported at proximal ends thereof by opposite end portions of the support rod 84. A pinch roller 88 extends between and is rotatably supported by free ends of the oscillatable members 86 and 87. A pair of front and rear support members 89 and 90 are arranged inwardly of the oscillatable members 86 and 87, with proximal ends thereof fixed to the support rod 84. The separator roller 91 extends between and is rotatably supported by free ends of the support members 89 and 90. Air cylinders 92 and 93 are attached to a rear surface of the vertical wall 73a and a front surface of the support wall 83, respectively. The air cylinders 92 and 93 have rods connected to the free ends of the oscillatable members 86 and 87. Thus, extension and contraction of the air cylinders 92 and 93 cause the pinch roller 88 to oscillate vertically about the support rod 84 through the oscillatable members 86 and 87. With this action, the adhesive tape T is pinched or released between the separator roller 91 and pinch roller 88. The pinch roller 88 is operatively connected to a motor 94 mounted on a rear surface of the oscillatable member 86, for advancing the adhesive tape T pinched between the pinch roller 88 and separator roller 91.

The tape applicator unit 60 and tape separator unit 61 have slide elements, not shown, attached to the support walls 75 and 83 and engaged with a horizontal rail 11b fixed to a rear surface of the base wall 11. Thus, tape applicator unit 60 and tape separator unit 61 are horizontally movable in a steady posture over the applicator table 30 and separator table 31, respectively.

As shown in FIG. 5, the adhesive tape T fed from the tape server 1 moves past a lower surface of the applicator roller 80 of the tape applicator unit 60 to be wound around the separator roller 91 and pinch roller 88 of the tape separator unit 61. The adhesive tape T then moves to the tape collector 7.

As shown in FIG. 2, a wafer support arm 100 in thin plate form is disposed adjacent a front surface of the base wall 11 and adjacent a left portion of the slot 11a. The wafer support arm 100 temporarily supports wafer W transferred from the applicator table 30 to the separator table 31. The wafer support arm 100 has a proximal end thereof connected to a rotary actuator not shown. The rotary actuator is operable to move a free end of the wafer support arm 100 horizontally through the slot 11a to a position above the separator table 31 as shown in a phantom line in FIG. 2. In this position, the wafer support arm 100 supports the wafer W by the lower surface thereof.

As shown in FIG. 3, the tape collector 7 is disposed adjacent a leftward rear portion of the base wall 11. A tape collecting roll 110 of adhesive tape T carrying the resist pattern fixed thereto is fitted on a rotary axis 111 supported in horizontal posture by the rear surface of the base wall 11. The rotary axis 111 is operatively connected to a motor, not shown, to rotate the tape collecting roll 110. A circumvent roller 112 is supported in a cantilever fashion by an oscillatable arm 113 adjacent the tape collecting roll 110 for guiding the adhesive tape T reliably to the tape collecting roll 110. Below the tape collecting roll 110 are a fixed roller 114 extending horizontally, and a pinch roller 115 supported by an arm 116 for oscillating to press the adhesive tape T upon the fixed roller 114. The adhesive tape T advancing from the tape separator unit 61 is moves past the fixed roller 114, pinch roller 115 and circumvent roller 112 to be taken up on the tape collecting roll 110.

The apparatus further includes a control panel 120 mounted on an upper right portion of the front surface of the base wall 11.

Next, an operation of the apparatus having the above construction will be described with reference to FIGS. 6A through 6J.

First, by way of preparation at the wafer supplying station 1, a cassette 14 containing a group of wafers W with a resist pattern is placed on the supplying table. The wafers W are stacked in the cassette 14 with resist-carrying surfaces facing upward. Then, the supplying table 13 is turned to a position in which the wafer outlet 14a is opposed to the transport mechanism 2.

The arm base 18 of the transport mechanism 2 is vertically moved to a position corresponding to a wafer W to be taken out. Next, the robot arm 19 is extended to a position directly under that wafer W inside the cassette 14. Then the arm base 18 is raised slightly, whereby the wafer W is transferred onto the distal end of the robot arm 19. Next, the robot arm 19 is contracted to take the first wafer W1 supported by the lower surface thereof out of the wafer outlet 14a of the cassette 14.

The wafer W1 taken out is transported to the alignment stage 3. Subsequently, the robot arm 19 is once retracted to a predetermined position. The orientation flat (or notch) of wafer W1 is detected and the position of wafer W1 is adjusted at the alignment stage 3. The positionally adjusted wafer W1 is transported to the applicator table 30 again by the robot arm 19.

Figure 6A:
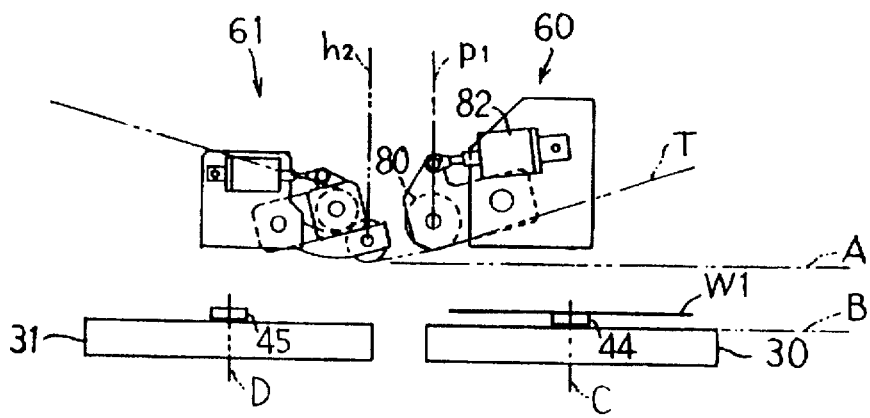
FIGS. 6A through 6J are explanatory views of an adhesive tape applying and separating operation in the first embodiment.

FIG. 6A shows a positional relationship among the applicator table 30 and separator table 31 and the tape applicator unit 60 and tape separator unit 61 in an initial state. The applicator table 30 lies in the standby position B for the first processing position C. The separator table 31 lies in the standby position B for the second processing position D. The tape applicator unit 60 lies in the application start position $p_1$ of the applying and separating position A. The tape separator unit 61 lies in the separation finish position $h_2$ of the applying and separating position A.

The wafer W1 taken out first is suction-supported by the suction pad 44 of the applicator table 30 in the standby position B, with the surface of wafer W1 carrying the resist pattern facing upward. Normally, the absorption pad 44 or 45 of the applicator table 30 or separator table 31 in the standby position B is set to a position slightly protruding from the surface of the applicator or separator table 30 or 31, so that the distal end of the robot arm 19 of the transport mechanism 2 or the wafer support arm 100, when transporting the wafer W, may enter a space between the wafer W supported on the suction pad 44 or 45 and the applicator or separator table 30 or 31. At this time, the air cylinders 81 and 82 of the tape applicator unit 60 in the applying and separating position A above the separator table 31 are contracted to maintain the applicator roller 80 slightly raised.

Figure 6B:
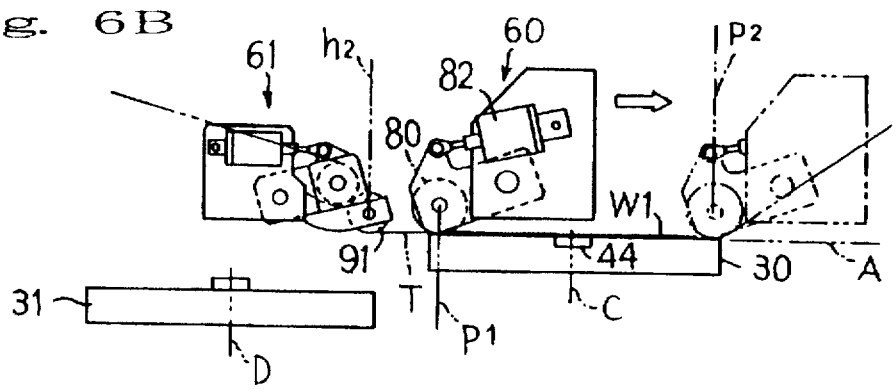

As shown in FIG. 6B, the applicator table 30 supporting the wafer W1 is raised to the applying and separating position A by extension of the air cylinder 42 of the applicator table lift mechanism 40. At the same time, the suction pad 44 subsides into the applicator table 30 whereby the wafer W1 is supported on the applicator table 30. At this time, the applicator roller 80 of the tape applicator unit 60 is slightly lowered by extension of the air cylinders 81 and 82. As a result, the adhesive tape T extending between the applicator roller 80 and the separator roller 91 of the tape separator unit 61 is deformed into a substantially horizontal form. When the applicator roller 80 and applicator table 30 contact each other in the application start position $p_1$ of the applying and separating position A, the motor 66 of the horizontal tape applicator unit drive mechanism 50 is operated to move the tape applicator unit 60 including the applicator roller 80 horizontally toward the application finish position $p_2$ (rightward in FIG. 6B), applying the adhesive tape T to the surface of wafer W1.

The wafer W1 is heated by the heater of the applicator table 30 from the time the wafer W1 is supported on the applicator table 30. As a result, the adhesive of adhesive tape T becomes soft and flows into the recesses of the resist pattern on the surface of wafer W1. In this way, an area of contact between the adhesive and the resist pattern is enlarged to improve cohesion therebetween.

Figure 6C:
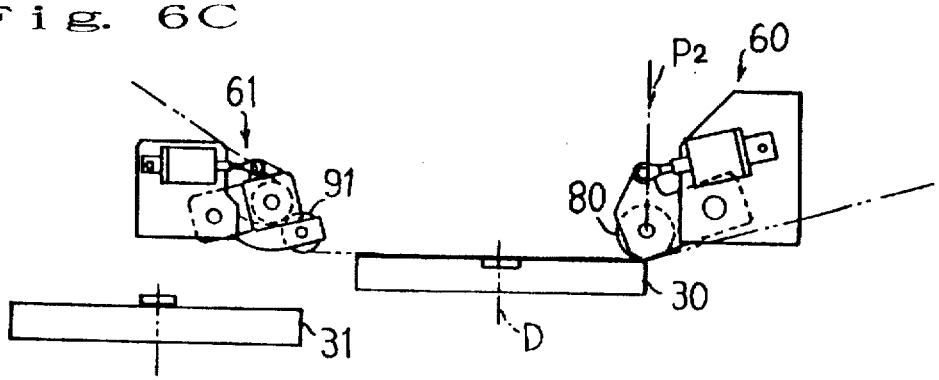

When the application of adhesive tape T to the wafer W1 is completed, the tape applicator unit 60 lies in the application finish position $p_2$ (shown in phantom lines in FIG. 6B), and the tape separator unit 61 remains in the separation finish position $h_2$ which is its initial position. The adhesive tape T between the applicator roller 80 and separator roller 91 remains sticking to the surface of wafer W. In this state, as shown in FIG. 6C, the motor 55 of the horizontal table drive mechanism 50 and the motors 66 and 67 of the horizontal tape applicator and separator unit drive mechanisms 70 and 71 are operated to move the applicator table 30, separator table 31, tape applicator unit 60 and tape separator unit 61 horizontally, thereby moving the applicator table 30 from the first processing position C to the second processing position D. For expediency of illustration, FIG. 6C depicts shortened distances of horizontal movement of the applicator table 30 and separator table 31 and the tape applicator unit and separator unit 60 and 61.

Figure 6D:
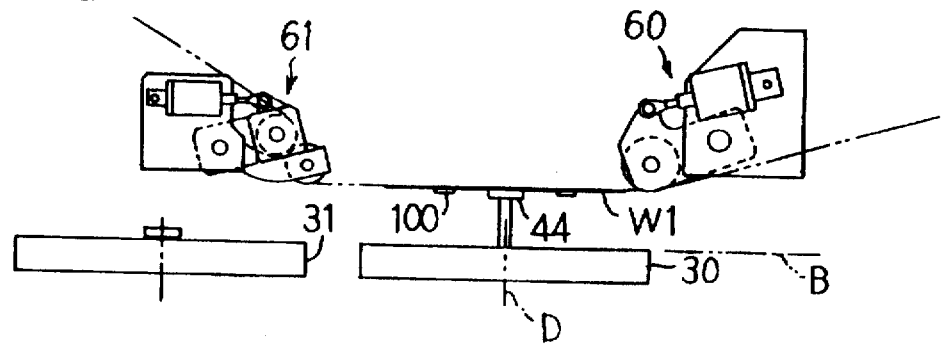
Figure 6E:
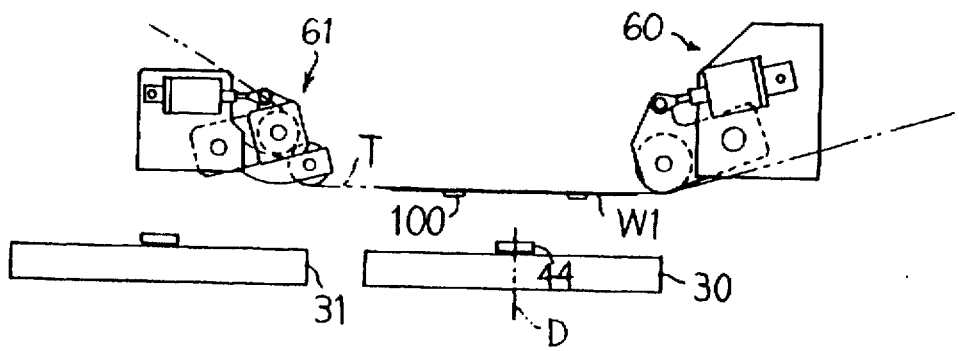

As shown in FIG. 6D, the suction pad 44 of the applicator table 30 is extended to support the wafer W1, and the air cylinder 42 of the applicator table lift mechanism 40 is contracted to lower the applicator table 30 to the standby position B. Subsequently, the distal end of the wafer support arm 100 is swung horizontally by operation of the rotary actuator to the position directly under the wafer W1 supported by the suction pad 44 of the applicator table 30. Next, as shown in FIG. 6E, the suction pad 44 of the applicator table 30 is lowered whereby the wafer W1 is temporarily placed on the distal end of the wafer support arm 100.

Figure 6F:
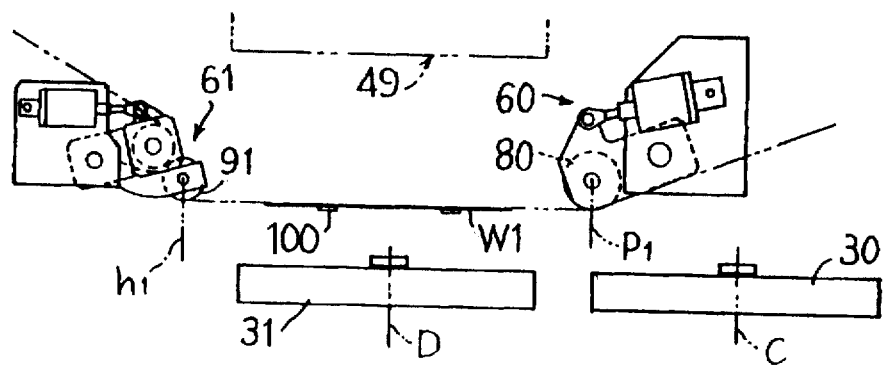

In this state, the motor 55 of the horizontal table drive mechanism 50 is operated to move the applicator table 30 and separator table 31 horizontally in order to transfer the wafer W1 to the separator table 31. That is, as shown in FIG. 6F, only the applicator table 30 and separator table 31 move horizontally to the initial position so that the applicator table 30 moves from the second processing position D back to the first processing position C. Consequently, the separator table 31 moves to the position (second processing position D) under the wafer W1 having the adhesive tape T between the tape applicator unit 60 and tape separator unit 61 applied to the upper surface thereof and supported at the lower surface by the wafer support arm 100, with the tape separator unit 61 moving relative thereto to the separation start position $h_1$. At this time, the tape separator unit 61 makes a slight horizontal movement, so that the applicator roller 80 moves from the application finish position $p_2$ to the application start position $p_1$.

Figure 6G:
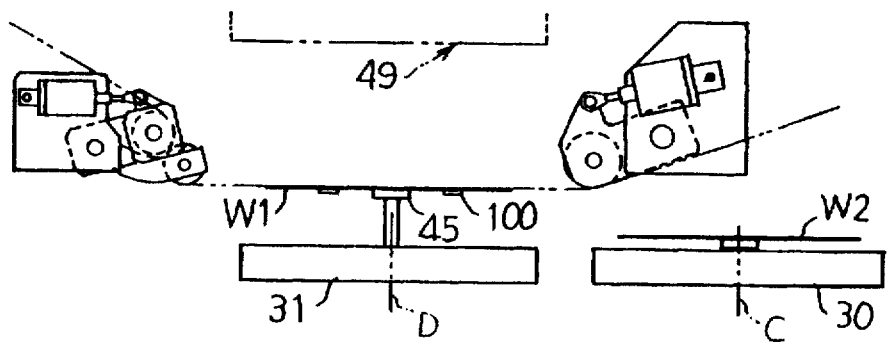
Figure 6H:
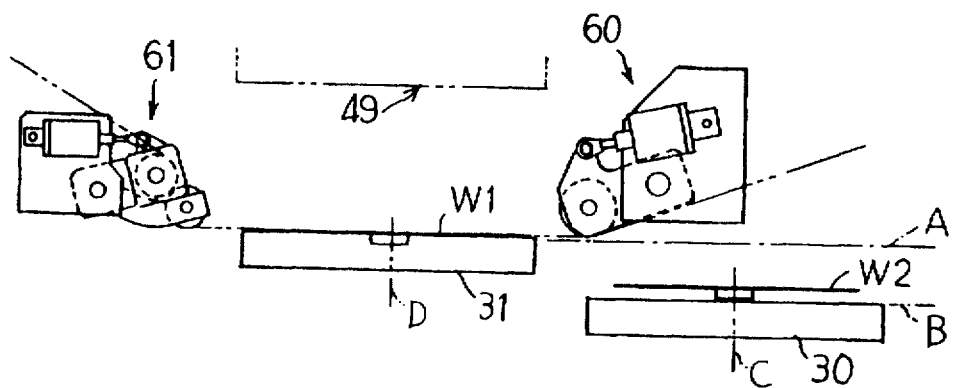

Next, as shown in FIG. 6G, the suction pad 45 of the separator table 31 is raised into contact with the lower surface of wafer W1. At this time, a next wafer W2 is transported to the applicator table 30 by the robot arm 19. As shown in FIG. 6H, the air cylinder 43 of the separator table lift mechanism 41 is extended to raise the wafer W along with the separator table 31 to the applying and separating position A.

Figure 6I:
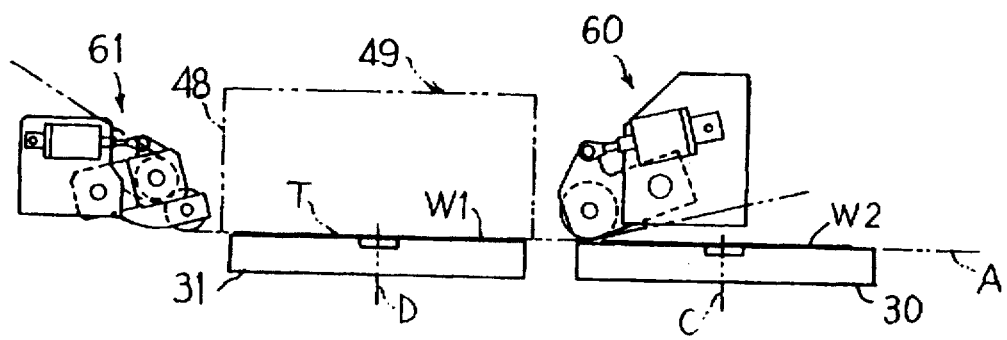

Subsequently, as shown in FIG. 6I, the hood 48 of the ultraviolet irradiating unit 49 standing by above the separator table 31 is lowered to the separator table 31 to prepare for prevention of ultraviolet leakage outwardly of the separator table 31. Then, the ultraviolet lamp 46 of the ultraviolet ray generator 47 is turned on to irradiate the wafer W1 with ultraviolet rays. With the ultraviolet irradiation, the adhesive of adhesive tape T of the ultraviolet curable type applied to the surface of wafer W1 cures to promote its cohesion with the resist pattern. At this time, the next wafer W2 is raised with the applicator table 30 to the applying and separating position A.

Figure 6J:
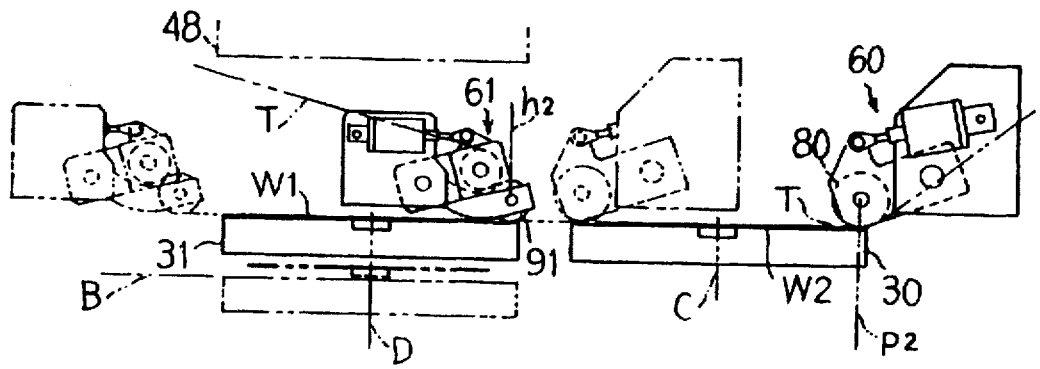

When the ultraviolet irradiation of wafer W1 is completed, the hood 48 is retracted upward as shown in FIG. 6J. Next, the motor 67 of the horizontal tape separator unit drive mechanism 71 is operated to move the tape separator unit 61 including the separator roller 91 horizontally toward the separation finish position $h_2$ (rightward in FIG. 6J). As a result, the resist pattern is separated along with the adhesive tape T from the surface of wafer W1 on the separator table 31. At substantially the same time, the motor 66 of the horizontal tape applicator unit drive mechanism 70 is operated to move the tape applicator unit 60 horizontally to the application finish position p₂. As a result, the adhesive tape T is applied to the surface of next wafer W2 on the applicator table 30. In this way, application and separation of adhesive tape T are carried out in parallel, to improve the processing efficiency (throughput) of the apparatus.

Subsequently, the separator table 30 is lowered to the standby position B. The robot arm 19 of the transport mechanism 2 makes flexing and swinging action to transport the wafer W1 stripped of the resist pattern from the separator table 31 and store the wafer W1 in the cassette 16 at the wafer collecting station 8. The processed wafer W may be stored in the cassette 16 after adjusting the position thereof at the alignment stage 3 as necessary. The operation shown in FIG. 6C et seq. is repeated for the wafer W2 having adhesive tape T applied thereto on the applicator table 30. The portion of adhesive tape T used in removing the resist pattern from the wafer W1 is taken up on the tape collecting roll 110 of the tape collector 7 through the repeated operation.

This invention may be worked with the foregoing processes in the first embodiment modified as follows. The modification will be described with reference to FIGS. 7A through 7G. This modification differs from the foregoing embodiment in the positional relationship between the applicator table 30 and separator table 31 of the table assembly 5. In the foregoing embodiment, in the initial state (FIG. 6A), the applicator table 30 lies in the first processing position C and the separator table 31 in the second processing position D. The slid space corresponding to one table is provided to the left of the second processing position D so that the applicator table 30 may move from the first processing position C to the second processing position D. In this modification, on the other hand, a slide space corresponding to one table is provided to the right of the first processing position C for allowing the separator table 31 to move horizontally from the second processing position D in the initial state shown in FIG. 7A to the first processing position C. The ultraviolet irradiating unit 49 stands by above the applicator table 30 in the first processing position C.

Figure 7A:
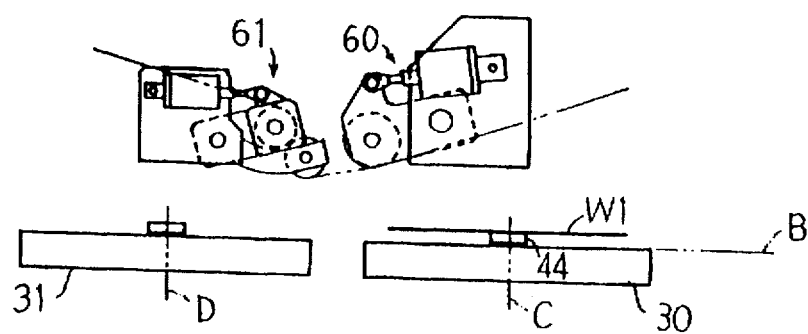
FIGS. 7A through 7G are explanatory views of an adhesive tape applying and separating operation in a modification of the first embodiment.
Figure 7B:
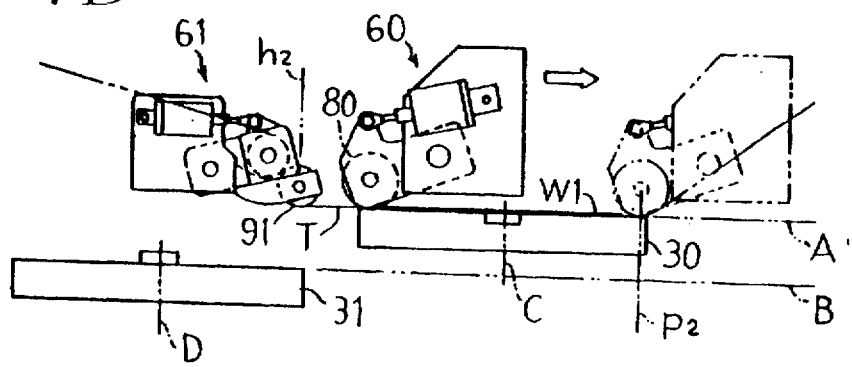

FIGS. 7A and 7B show the same processes as in the foregoing embodiment (FIGS. 6A and 6B). Wafer W1 is placed on the suction pad 44 of the applicator table 30 in the standby position B for the first processing position C. Next, the applicator table 30 is raised to the applying and separating position A whereby the wafer W1 is supported by the applicator table 30. When the applicator roller 80 and applicator table 30 contact each other in the application start position p₁ of the applying and separating position A, the tape applicator unit 60 is moved horizontally toward the application finish position p₂ (rightward in FIG. 7B), applying the adhesive tape T to the surface of wafer W1. The wafer W1 is heated at this time.

Figure 7C:
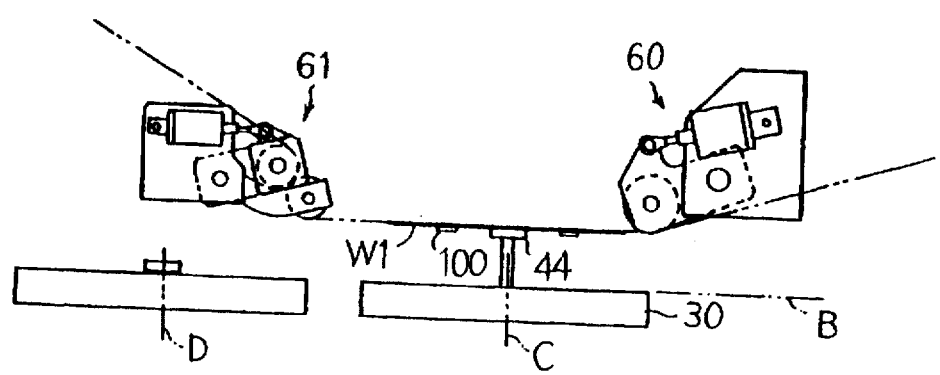

As shown in FIG. 7C, the wafer W1 is then supported by the suction pad 44 of the applicator table 30, and the applicator table 30 is lowered to the standby position B. Subsequently, the wafer support arm 100 swings horizontally to a position under the wafer W1. The wafer W1 is temporarily supported by the distal end of the wafer support arm 100.

Figure 7D:
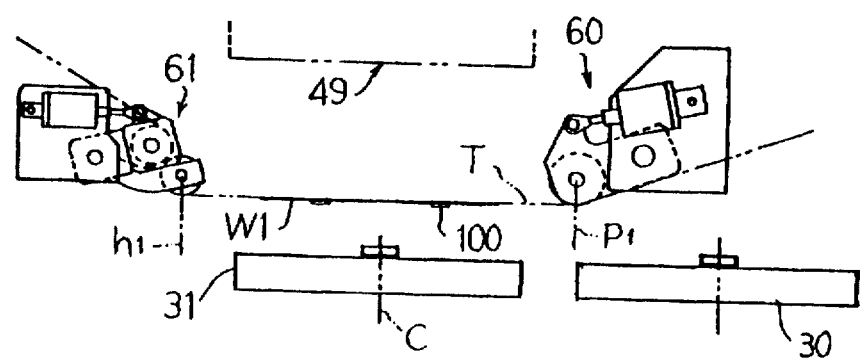

Next, as shown in FIG. 7D, the applicator table 30 and separator table 31, are moved horizontally, so that the separator table 31 moves from the second processing position D to the first processing position C in order to transfer the wafer W1 to the separator table 31. At this time, the tape separator unit 61 makes a slight horizontal movement, so that the applicator roller 80 moves to the application start position p₁.

Figure 7E:
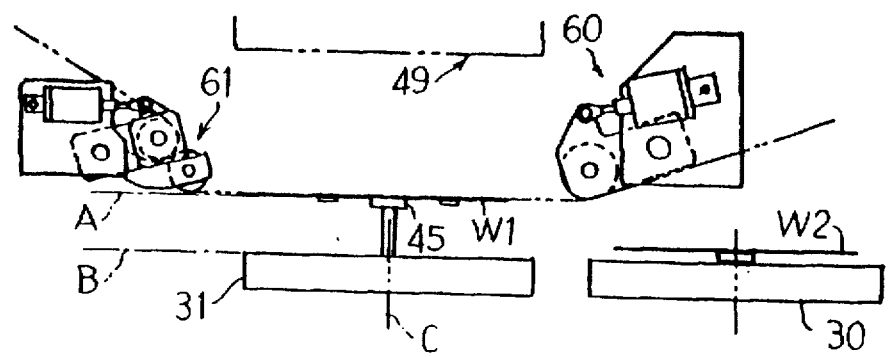
Figure 7F:
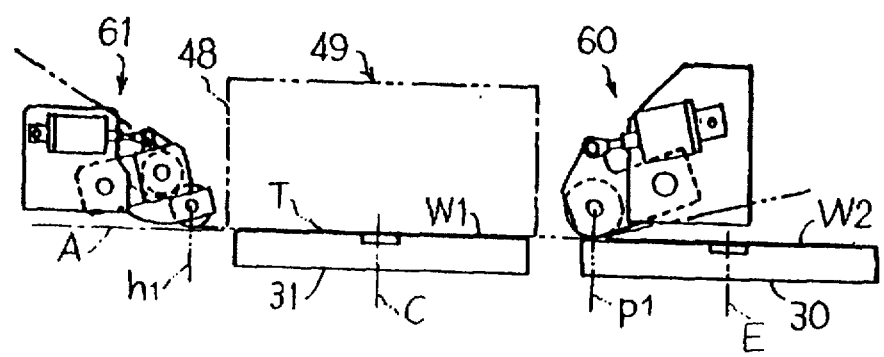

Next, as shown in FIG. 7E, the suction pad 45 of the separator table 31 is raised into contact with the lower surface of wafer W1. At this time, a next wafer W2 is transported to the applicator table 30 by the robot arm 19. Then, the separator table 31 is raised to the applying and separating position A. As shown in FIG. 7F, the ultraviolet irradiating unit 49 is lowered to irradiate the wafer W1 with ultraviolet rays. At this time, the applicator table 30 is raised to the applying and separating position A.

It is thought appropriate here to confirm the positional relationship among the applicator table 30 and separator table 31 and the tape applicator unit 60 and tape separator unit 61 in this state. The separator table 31 lies in the applying and separating position A of the first processing position C. The applicator table 30 lies in an applying and separating position E in the slide space to the right of the first processing position C. The tape applicator unit 60 and tape separator unit 61 are in contact with the applicator table 30 and separator table 31 in the application and separation start positions p₁ and h₁, respectively.

Figure 7G:
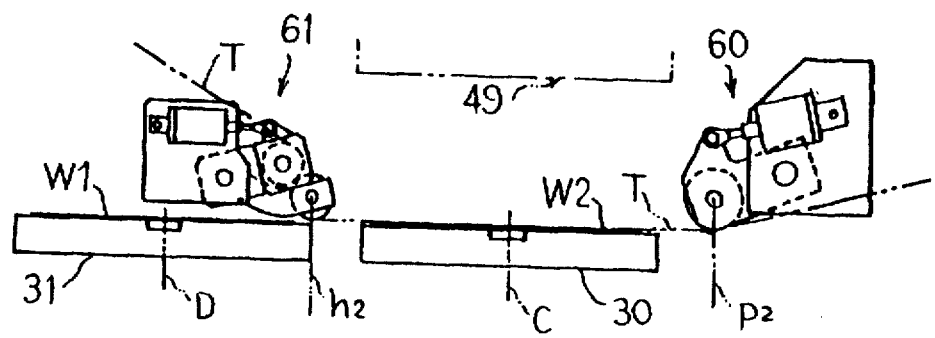

When the ultraviolet irradiation of wafer W1 is completed, the ultraviolet irradiating unit 49 is retracted upward as shown in FIG. 7G. Next, the applicator table 30 and separator table 31 are moved horizontally, with the separator table 31 moving from the first processing position C back to the second processing section D. In this way, tape separation from wafer W1 and tape application to wafer W2 are carried out in parallel, to improve the processing efficiency of the apparatus.

With the horizontal movement of the applicator table 30 and separator table 31, the tape applicator unit 60 and tape separator unit 61 standing still are shifted relative thereto to reach the application and separation finish positions p₂ and h₂ as shown in FIG. 7C. Then, the applicator table 30 and separator table 31 are lowered to the standby position B. The wafer W1 stripped of the resist pattern is transported by the transport mechanism 2 from the separator table 31 and stored in the cassette 16 at the wafer collecting station 8. The operation shown in FIG. 7C et seq. is repeated for the wafer W2 having adhesive tape T applied thereto on the applicator table 30.

According to the modified process, tape application to wafer W2 and tape separation from wafer W1 are carried out simultaneously in parallel through the horizontal movement of the applicator table 30 and separator table 31 for transferring wafer W1 to which the tape has been applied and the opposite horizontal movement. Thus, a processing cycle may be completed through a short operation involving one reciprocation of the applicator table 30 and separator table 31, to promote the processing efficiency further.

<Second Embodiment>

Figure 8:
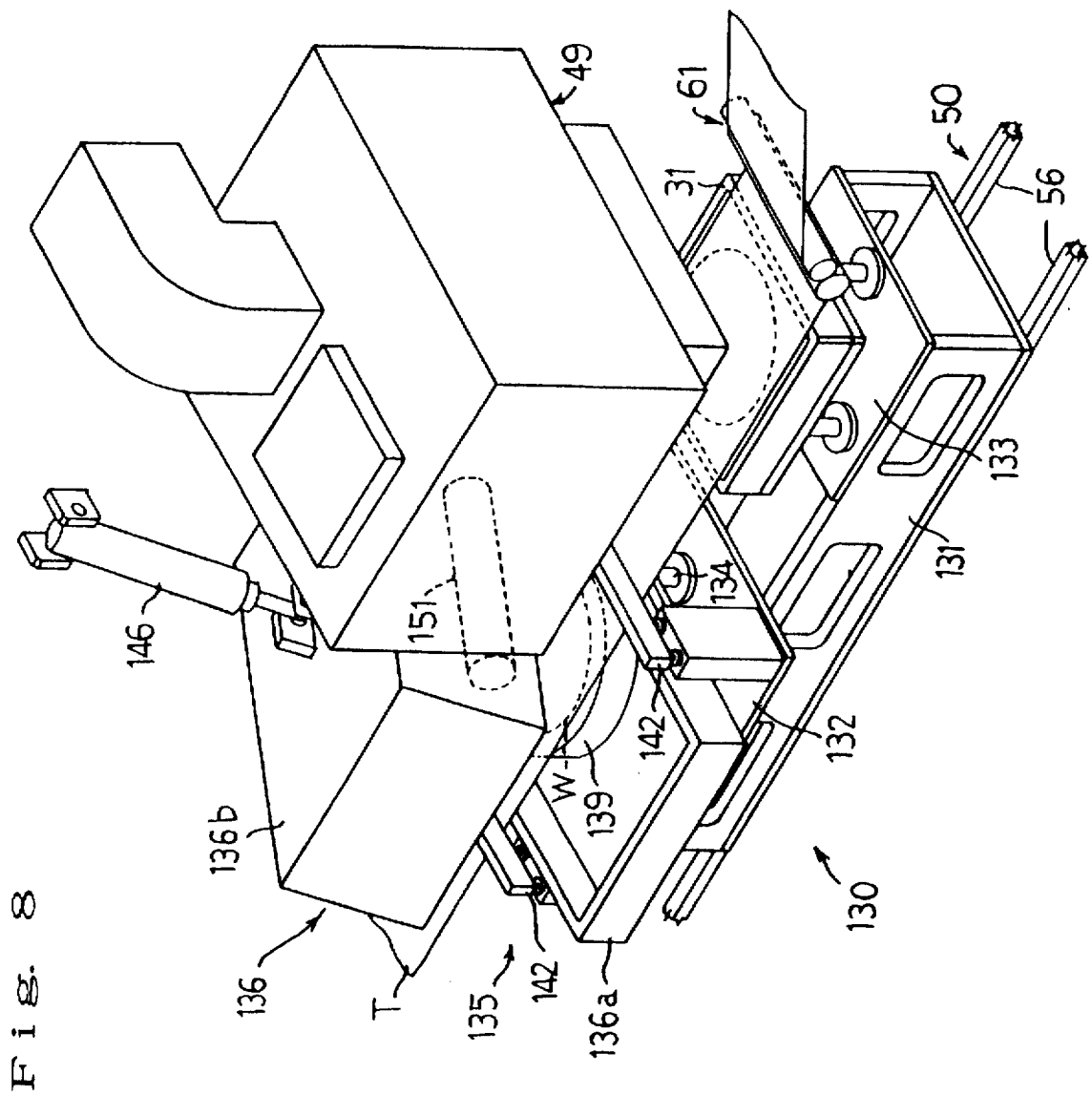
FIG. 8 is a perspective view of a principal portion of a second embodiment.
Figure 9:
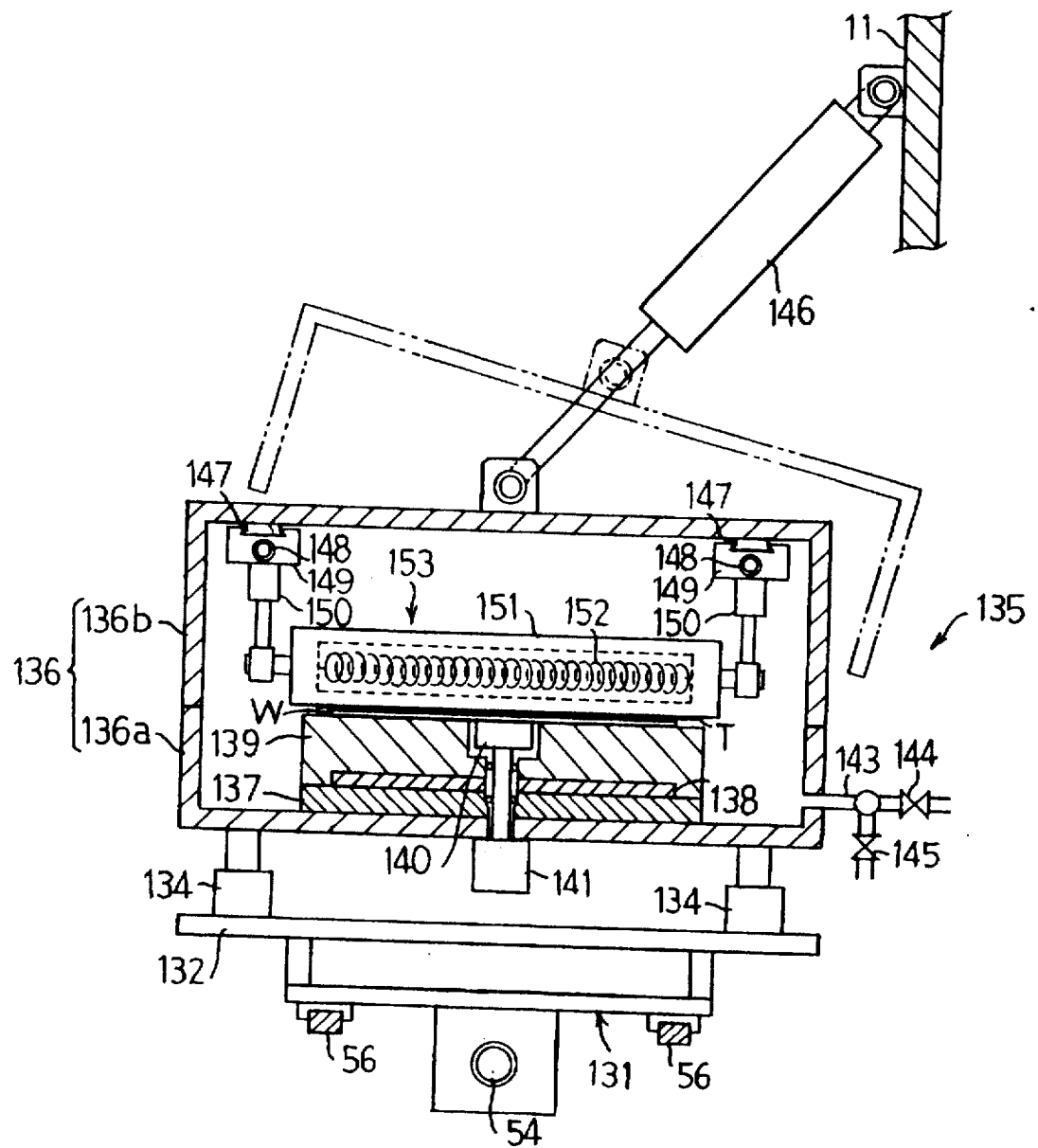
FIG. 9 is a sectional view of the principal portion of the second embodiment.

A principal portion of an apparatus in the second embodiment of this invention will be described with reference to FIGS. 8 and 9. FIG. 8 is a perspective view of an applicator and separator table assembly 130 and a decompression mechanism 135 of this embodiment seen from a rearward position. FIG. 9 is a sectional side view of an applicator table 139, a tape applicator unit 153 and the decompression mechanism 135. In these figures, like reference numerals are used to dentify like parts in the first embodiment and will not be described again.

The characteristic feature of the second embodiment lies in the decompression mechanism 135 added to the tape applying construction in the first embodiment. Thus, in the second embodiment, adhesive tape is applied to a wafer on the applicator table in a decompressed atmosphere.

As shown in FIGS. 8 and 9, the applicator and separator table assembly 130 is mounted on the fixed plates 132 and 133 arranged on a movable member 131 slidable along the slide rails 56 and meshed with the screw shaft 54 of the horizontal table drive mechanism 50. The separator table 31 and tape separator unit 61 on or above the fixed plate 133 are the same as in the first embodiment, and will not described again. A pair of right and left air cylinders 134 are erected on an upper surface of the fixed plate 132. The air cylinders 134 have rods connected at upper ends thereof to a lower enclosure 136a of decompression enclosure 136 opening upward. The applicator table 139 having a heater 138 is mounted in the lower enclosure 136a through an insulating material 137. The applicator table 139 has a suction pad 140 disposed centrally thereof and connected to a rod of an air cylinder 141 for vertically moving wafer W. The air cylinder 141 is fixed in airtight condition to a lower surface of the lower enclosure 136a. A pair of tape pinch members 142 are arranged at opposite sides of the lower enclosure 136a for pinching adhesive tape T. The adhesive tape T supplied from the tape server 4 (FIG. 3) is fed along the tape pinch members 142 by guide rollers not shown.

A branched pipe 143 is attached to a peripheral wall of the lower enclosure 136a. One branch thereof is connected to a vacuum pump not shown, through a reducing valve 144. The other branch is open to the atmosphere through a reducing valve 145.

An upper enclosure 136b is opposed to the lower enclosure 136a, with an upper surface thereof connected to a forward end of a rod of an air cylinder 146 fixed to the rear surface of the base wall 11. As shown in solid lines in FIG. 9, expansion of the air cylinder 146 places the upper enclosure 136b in a closed position relative to the lower enclosure 136a.

The upper enclosure 136b contains, attached to an upper inner surface thereof, a pair of guide rails 147 and screw shafts 148 extending parallel thereto. On end of each screw shaft 148 is connected to a motor not shown. Movable members 149 are movable along the slide rails 147 and are penetrated by and meshed with the screw shafts 148, respectively. An air cylinder 150 depends from a lower surface of each movable member 149, with an applicator roller 151 rotatably supported at a forward end of a rod of the air cylinder 150. Thus, with extension of the air cylinders 150, the applicator roller 151 contacts wafer W supported on the applicator table 139, and is horizontally movable by operation of the motors. The applicator roller 151 contains a heater 152 for heating from room temperature to approximately 130° C. Thus, the adhesive of adhesive tape T may be heated also through its backing surface, thereby to improve the heating efficiency. The portion including the decompression enclosure 136 and the vacuous pump not shown corresponds to the decompression mechanism 135 of this invention. The portion including the applicator roller 151 corresponds to the tape applicator unit 153 of this invention.

An operation to apply adhesive tape T to wafer W in the second embodiment will be described hereinafter.

In an initial state, the air cylinders 134 are contracted to maintain the lower enclosure 136a in a lower position. In this state, the applicator table 139 is in a standby position B, with the suction pad 140 subsided in the applicator table 139 by contraction of the air cylinder 141. The upper enclosure 136b is opened, as shown in a two-dot-and-dash line in FIG. 9, by contraction of the air cylinder 146. The applicator roller 151 in the upper enclosure 136b is raised by contraction of the air cylinders 150. The adhesive tape T is pinched between the tape pinch members 142.

First, the air cylinder 141 is extended to project the suction pad 140 slightly from the applicator table 139, and wafer W is transported to the suction pad 140 by the robot arm 19. The air cylinder 141 is contracted again to allow the wafer W to be suction-supported by the applicator table 139. Subsequently, with extension of the air cylinders 134, the applicator table 139 supporting the wafer W and the lower enclosure 136a move together up to an applying position A. At this time, the adhesive tape T and wafer W are maintained slightly apart from each other by the tape pinch members 142 and the like. Then, the air cylinder 146 is extended slowly to fit the upper enclosure 136b on the lower enclosure 136a at the peripheral walls, whereby the decompression enclosure 136 is sealed airtight.

Next, the reducing valve 144 connected to the vacuum pump not shown is opened, and the vacuum pump is operated to decompress the interior of decompression enclosure 136 to approximately 5 to 10 Torr. When the decompression is completed, the vacuum pump is stopped operating and the reducing valve 144 is closed. Then, the air cylinders 150 are extended to move the applicator roller 151 into contact with the wafer W through the adhesive tape T in the application start position $p_1$. Next, the motors, not shown, connected to the screw shafts 148 are operated to move the applicator roller 151 horizontally toward the application finish position $p_2$, applying the adhesive tape T to the wafer W. Since, at this time, the interior of decompression enclosure 136 is decompressed, the adhesive tape T is applied to the wafer W in the absence of air bubbles from the recesses and the like of the resist pattern on the wafer W. The adhesive of adhesive tape T is heated from below by the heater 138 and from above by the heater 152 in the applicator roller 151, thereby softening in a short time to improve its cohesion with the resist pattern.

When the adhesive tape T has been applied to the wafer W, the reducing valve 145 is opened to reinstate the interior of the decompression enclosure 136 in the atmospheric pressure condition. At the same time, the air cylinder 146 is contracted to raise the upper enclosure 136b. As a result, atmospheric pressure is applied uniformly over the surface of wafer W to promote the cohesion between the adhesive of adhesive tape T and the resist pattern. Subsequently, the tape pinch members 142 are put out of operation, and the wafer W proceeds to the next stage by the same operation as in the first embodiment.

<Third Embodiment>

Figure 10:
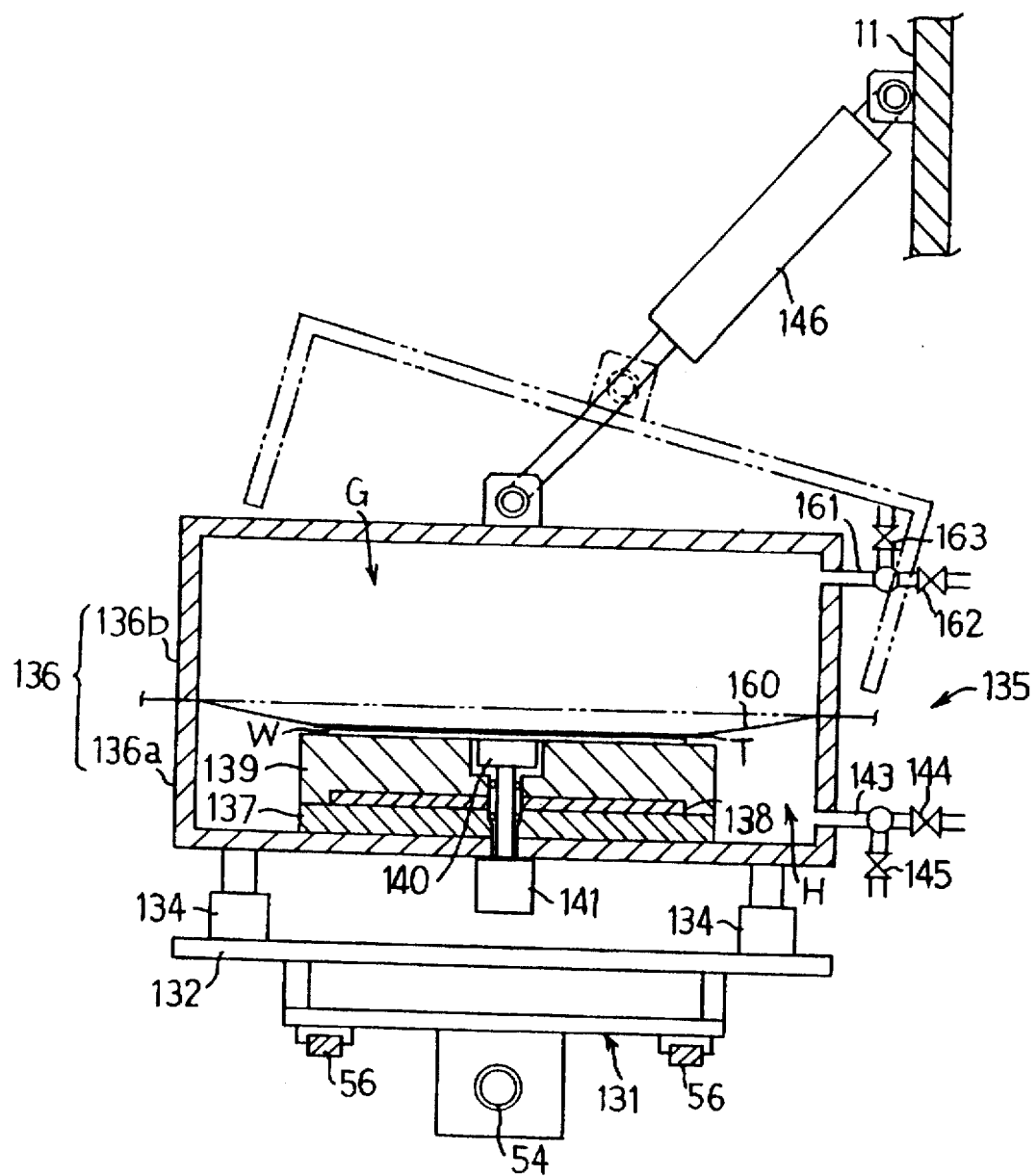
FIG. 10 is a sectional view of a principal portion of a third embodiment.

A principal portion of a resist removing apparatus in a third embodiment will be described with reference to FIG. 10. FIG. 10 is a sectional side view of an applicator table 139, tape applicator unit 153 and decompression mechanism 135 in the third embodiment. Basically, this embodiment is a modification of the tape applicator unit 153 in the second embodiment.

The apparatus in the third embodiments excludes the tape applicator unit 153 inside the upper enclosure 136b of the second embodiment. Instead, an elastic member 160 formed of thin rubber, for example, is provided to traverse the opening of the upper enclosure 136b, and a branched pipe 161 is attached also to a peripheral wall of the upper enclosure 136b. A vacuum pump not shown is connected to the branch having a reducing valve 162. A reducing valve 163 on the other branch communicates to the atmosphere.

Specifically, the decompression enclosure 136 with the lower enclosure 136a and upper enclosure 136b fitted together is divided by the elastic member 160 into an upper part G (decompression enclosure 136 above the elastic member) and a lower part H (decompression enclosure 136 below the elastic member).

As shown in two-dot-and-dash lines in FIG. 10, the elastic member 160 and adhesive tape T right under the elastic member stand by in horizontal posture above wafer W. Then, the reducing valves 144 and 162 are opened and the vacuum pumps are operated. The upper part G of the decompression enclosure 136 is decompressed to approximately 30 Torr, and the lower part H of the decompression tank 136 is decompressed gradually to about 1 Torr. Thus, the lower part H is at a lower pressure than the upper part G. As shown in a solid line in FIG. 10, the thin elastic member 160 expands to deform the adhesive tape T into a bow shape with a middle portion thereof moving into the lower part H. Thus, the adhesive tape T is applied to the wafer W in concentric circles from a substantially central position toward peripheries. When the tape has been applied, the reducing valves 145 and 163 are opened to reinstate the decompression enclosure 136 in the atmospheric pressure condition. The air cylinder 146 is operated to raise the upper enclosure 136b. As a result, atmospheric pressure is applied evenly over the wafer W through the adhesive tape T, to produce the same effect as in the second embodiment.

In the first and second embodiments, the adhesive tape T need not be the ultraviolet curable type and the mechanism for irradiating ultraviolet rays need not be used if the adhesive tape T has strong adhesion or if the resist pattern adheres to the surface of wafer with a relatively low strength. Further, it is not absolutely necessary to heat the adhesive of adhesive tape T with the heater(s).

The foregoing embodiments have been described exemplifying removal of an unnecessary resist pattern from the surface of wafer W. This invention is not limited thereto, but is applicable to processing of articles having images formed of resist patterns.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for removing resist patterns from surfaces of articles by applying adhesive tape in strip form to the surfaces of the articles covered with the resist patterns, and separating the adhesive tape from the surfaces of the articles, said apparatus comprising:

an applicator table for supporting said articles when said adhesive tape is applied to said surfaces of said articles covered with said resist patterns;

an applicator table lift mechanism for vertically moving said applicator table between an upper applying position and a lower standby position;

a separator table disposed adjacent said applicator table for supporting said articles when said adhesive tape is separated from said surfaces of said articles;

a separator table lift mechanism for vertically moving said separator table between an upper separating position and a lower standby position;

a transport mechanism for transporting said articles to said applicator table, and transporting said articles from said separator table;

a tape applicator unit for applying said adhesive tape in strip form to said surfaces of said articles supported on said applicator table;

a tape separator unit for separating said adhesive tape from said surfaces of said articles supported on said separator table; and a relative drive mechanism for horizontally moving a set of said tape applicator unit and said tape separator unit and a set of said applicator table and said separator table relative to each other;

wherein said mechanisms are operable to apply and separate said adhesive tape to/from said surfaces of said articles in parallel through the following processes (1)–(7):

(1) said applicator table is raised to said applying position after an article covered with the resist pattern is placed on said applicator table;
   (2) said tape applicator unit applies said adhesive tape in strip form to the article on said applicator table;
   (3) said applicator table is lowered to said standby position while supporting the article through the adhesive tape in strip form extending between said tape applicator unit and said tape separator unit;
   (4) the set of said tape applicator unit and said tape separator unit and the set of said applicator table and said separator table are moved horizontally relative to each other, whereby said separator table moves under the article supported through said adhesive tape;
   (5) a next article is transported to and placed on said applicator table unloaded and lying in said standby position;
   (6) said applicator table is moved to said applying position, and said separator table to said separating position; and
   (7) said tape applicator unit and said tape separator unit operate substantively simultaneously, said tape separator unit separating said adhesive tape from the article on said separator table, said tape applicator unit applying said adhesive tape to the next article on said applicator table.

2. An apparatus as defined in claim 1, further comprising a wafer supplying station for receiving a cassette storing, one over another, the articles covered with the resist patterns, said transport mechanism being operable to take the articles successively out of said cassette delivered to said wafer supplying station and transport the articles to said applicator table.

3. An apparatus as defined in claim 1, further comprising a wafer collecting station for receiving a cassette for storing, one over another, the articles stripped of the resist patterns, said transport mechanism being operable to transport the articles stripped of the resist patterns from said separator table successively to said cassette delivered to said wafer collecting station.

4. An apparatus as defined in claim 1, further comprising an alignment mechanism for positionally adjusting the articles at least before the articles covered with the resist patterns are transported to said applicator table.

5. An apparatus as defined in claim 1, said applicator table includes heating means for heating the articles placed thereon.

6. An apparatus as defined in claim 1, said tape applicator unit includes heating means for heating said adhesive tape when applying said adhesive tape to the articles on said applicator table.

7. An apparatus as defined in claim 1, wherein said adhesive tape is an ultraviolet curable adhesive tape, and said apparatus further comprises ultraviolet generating means for irradiating with ultraviolet rays said adhesive tape applied to the article supported on the separator table after said separator table is raised to said separating position in the process (6) and before said adhesive tape is separated from the article on said separator table in the process (7).

8. An apparatus as defined in claim 1, wherein said relative drive mechanism is operable to move the set of said applicator table and said separator table horizontally.

9. An apparatus as defined in claim 1, further comprising a decompression mechanism for covering said applicator table and said tape applicator unit, said tape applicator unit carrying out the process (2) of applying said adhesive tape to the article on said applicator table in a decompressed atmosphere inside said decompression mechanism.

10. An apparatus as defined in claim 9, wherein said tape applicator unit includes a horizontally movable roller.

11. An apparatus as defined in claim 9, wherein said tape applicator unit includes a thin elastic member for dividing a decompression enclosure in said decompression mechanism into a lower enclosure and an upper enclosure, said elastic member being expanded toward said lower enclosure by reducing an internal pressure of said lower enclosure below an internal pressure of said upper enclosure to produce a pressure difference between said upper enclosure and said lower enclosure, to press said elastic member through said adhesive tape upon the surface of the article supported on said applicator table, thereby to apply said adhesive tape to said article.

* * * * *